United States Patent [19]

First

[11] 4,031,532

[45] June 21, 1977

[54] VOLTAGE TO FREQUENCY CONVERTER

[76] Inventor: David J. First, c/o D. J. Instruments Inc., 11 Esquire Road, North Billerica, Mass. 01862

[22] Filed: Dec. 29, 1975

[21] Appl. No.: 644,879

[52] U.S. Cl. .................... 340/347 NT; 235/92 CV; 235/92 R

[51] Int. Cl.² ...................................... H03K 13/02

[58] Field of Search ......... 340/347 NT; 235/92 NT, 235/92 CV

[56] References Cited

UNITED STATES PATENTS

| | | | |
|---|---|---|---|
| 3,504,267 | 3/1970 | James et al. ................ | 340/347 NT |
| 3,765,012 | 10/1973 | Grutzediek et al. ........ | 340/347 NT |
| 3,859,654 | 1/1975 | Harrison et al. ............ | 340/347 NT |
| 3,918,050 | 11/1975 | Dorsman ..................... | 340/347 NT |

Primary Examiner—Joseph M. Thesz
Attorney, Agent, or Firm—Cesari and McKenna

[57] ABSTRACT

A voltage to frequency converter includes an input signal integrator, a level detector connected to the output of the integrator, clock-signal-controlled logic illustratively comprising a D-type clocked flip-flop circuit connected to the output of the level detector, and a reference signal switch which applies a positive or negative reference signal to the integrator depending upon the logic level of the output of the logic. The polarity of the reference signal applied to the integrator is continuously switched causing the output of the integrator to move alternately in a positive and negative direction. Positive integration cycles are thus continuously opposed by negative integration cycles. The clock controlled logic forces each integration cycle to be an integral multiple of a clock signal pulse length in duration. The output of the logic is a pulsed signal having a pulse rate or frequency proportional to the input signal voltage. The duty cycle of the logic output pulses is representative of the input signal polarity. In one embodiment, the output pulses from the logic are counted and the result represents a true time integral, in digital form, of the input signal over the counting time period.

6 Claims, 4 Drawing Figures

VOLTAGE TO FREQUENCY CONVERTER

BACKGROUND OF THE INVENTION

This invention relates to a voltage to frequency converter and more particularly, to a converter which generates a pulsed output signal having a frequency and duty cycle corresponding to the voltage and polarity, respectively, of an applied input signal.

A voltage to frequency converter is a circuit which receives an input signal and generates a periodic output signal having a frequency that varies in accordance with the voltage of the input signal. Typically, the output signal from the converter is in the form of a series of logic level pulses, with the pulse rate of the output signal varying according to input signal voltage.

Such converters have many applications. For example, an unknown analog signal may be applied to the input of a voltage to frequency converter and the output pulses therefrom may be accumulated in a digital counter for a fixed period of time. The digital number contained in the counter can then be displayed to provide a visual indication of the input signal voltage. In many applications, it is required that the voltage to frequency conversion take place with a high degree of accuracy.

A typical prior voltage to frequency converter includes an input signal integrator comprising a capacitor in the feedback loop of an amplifier. The input signal is applied to the integrator through an input resistor. The capacitor is then charged at a rate determined by the voltage of the input signal and by the product of the capacitance of the capacitor and the resistance of the input resistor. When the output of the integrator reaches a predetermined level, the input signal is removed and a reference signal is applied until the capacitor is completely discharged. This sequence is typically repeated so that the converter oscillates at a frequency determined by the time required to charge and discharge the capacitor. The voltage of the input signal is thus proportional to the frequency of this oscillation.

The accuracy of a voltage to frequency converter of this type depends critically upon the stability of the capacitor and input resistor used therein. If the characteristics of these components change, or drift, with time, the frequency at which the converter oscillates changes even if the input signal voltage remains constant. Errors thus develop in the voltage to frequency conversion. To insure relatively high accuracy, the capacitor and input resistor used in these converters must typically be precision, stable components. Such components, however, are relatively expensive and add to the overall cost of the converter.

Another prior voltage to frequency converter utilizes an input signal reversing technique. The input signal is applied to an integrator, and the polarity of the input signal is reversed each time the integrator output reaches a predetermined level. Specifically, the input signal is applied to the integrator through a polarity reversing switch. A feedback capacitor in the integrator is alternately charged and discharged by the same voltage, but of opposite polarity. The average current through the input resistor and the average voltage across the capacitor are thus zero. Errors due to changes in the characteristics of these components thus tend to cancel with time.

In a voltage to frequency converter of that type, however, the accuracy of the output is dependent upon the stability of the input signal polarity reversing switch. If the switch resistance drifts, for example, errors develop. Also, when the input signal varies rapidly in polarity, due, for example, to noise near the zero voltage point, the polarity switch often gets confused, causing the input signal balancing cycle to be upset and errors to develop.

Still another prior voltage to frequency converter applies an input signal through an input resistor to a summing point which also receives either a positive or negative reference signal. The output of the summing point connects to the input of an integrator. The polarity of the reference signal that is applied to the summing point is selected by comparing the output of the integrator with certain fixed threshold voltages. The comparison is performed by two separate logic components, one for a positive input signal, and the other for a negative input signal.

This converter does not require an input signal polarity reversing switch, and thus eliminates the errors that can result therefrom. It, however, requires two separate switches and two separate logic components for controlling the application of the positive and negative reference signals to the summing point. The characteristics of these two switches and components can vary relative to one another, causing the applied reference signals to vary relative to one another in magnitude and duration. This can effect the accuracy of the converter. Also, in this converter, the average current passing through the input resistor is equal to the input voltage divided by the resistance of the input resistor. Thus, changes in the resistance of the input resistor directly affect the accuracy of this converter. To achieve high accuracy, this converter also requires a precision, stable input resistor.

Accordingly, it is a general object of the present invention to provide an improved voltage to frequency converter.

Another object of the invention is to provide a voltage to frequency converter which is relatively accurate but which does not require precision components.

Still another object of the invention is to provide a voltage to frequency converter which is relatively insensitive to noise in the input signal, particularly, noise around the zero voltage point.

SUMMARY OF THE INVENTION

In accordance with the present invention, a voltage to frequency converter receives an input signal of unknown voltage and polarity and generates a pulsed output having a frequency and duty cycle corresponding to the voltage and polarity, respectively, of the input signal. The input signal and a reference signal of predetermined magnitude and polarity are introduced to an integrator which provides an output that ramps in a positive or negative direction depending upon the polarity of the reference signal applied. A level detector determines whether the output of the integrator is greater or less than a predetermined level. A clock signal controlled logic section connects to the output of the level detector and controls a reference signal switch. The reference signal switch applies either a positive or negative reference signal to the integrator depending upon the logic level of the output of the logic section.

The logic output continuously shifts between first and second logic levels causing the reference signal switch to apply positive and negative reference signals to the integrator alternately. As a result, positive integration cycles are continuously opposed by negative integration cycles. Each integration cycle also has a duration which is an integral multiple of a clock signal pulse length.

The output of the converter is taken from the output of the logic section. This output has a zero frequency when the input signal magnitude is equal to that of the positive or negative reference signal, one half the frequency of the clock signal when the input signal magnitude is halfway between the positive and negative reference signals (i.e., at zero volts), and a proportional frequency when the input siganl magnitude is between these two extremes.

Also, with the input signal at zero volts, the duty cycle of the pulsed output of the logic means is exactly 50 percent. A positive polarity of the input signal causes the output of the logic to have a duty cycle greater than 50 percent, while a negative input signal causes the logic output to have a duty cycle less than 50 percent. Changes in the voltage and polarity of the input signal are directly reflected as changes in the frequency and duty cycle of the logic output.

Because positive and negative integration cycles are continuously alternated in the converter, errors caused by variations in the frequency and pulse symmetry of the clock signal tend to cancel. Additionally, errors caused by changes in the characteristics of the resistive and capacitive components used to determine each integration cycle also tend to cancel. As a result expensive, precision components are not required. The converter is thus relatively economical, yet provides a highly accurate indication of the magnitude and polarity of the input signal.

The invention is pointed out with particularity in the appended claims. The foregoing and other features and advantages of the invention will be better understood from the following detailed description taken in conjunction with the accompanying drawings.

BRIEF DESCRIPTION OF THE DRAWINGS

FIG. 3 shows an illustrative transducer bridge circuit utilizing the voltage to frequency converter of FIG. 1.

DETAILED DESCRIPTION

Figure 1:
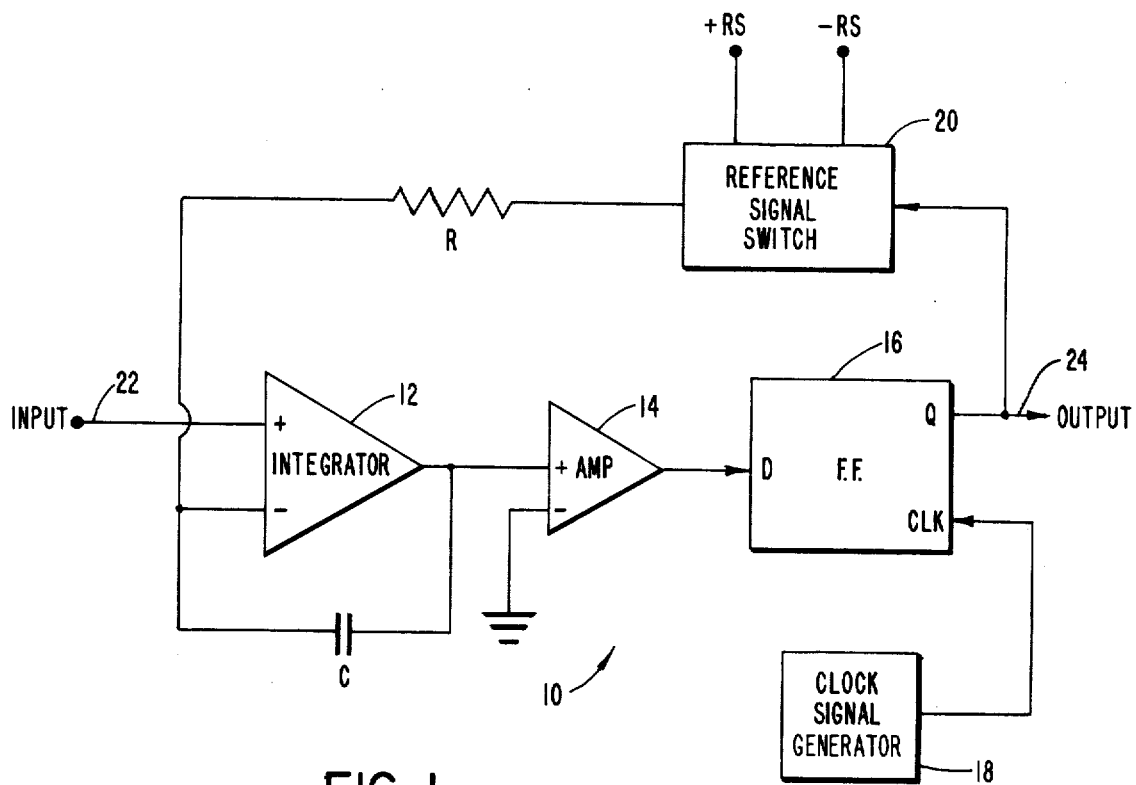
FIG. 1 shows a voltage to frequency converter embodied according to the invention.

FIG. 1 illustrates a voltage to frequency converter 10 embodied in accordance with the present invention. The converter 10 includes an integrator 12 including a capacitor C in the feedback loop of an operational amplifier, a level detecting amplifier 14, a logic means 16 illustratively comprising a D-type flip-flop circuit, clock signal generator 18 and reference signal switch 20 which selects between reference signals +RS and −RS. An unknown voltage signal is applied at input 22 to the converter 10. Output 24 of the converter 10 is a pulsed signal having a pulse rate, or frequency, that varies according to the voltage of the unknown input signal.

As seen in FIG. 1, the input 22 connects to the noninverting input of the integrator 12. The output of the integrator 12 is fed back through the capacitor C to the inverting input of the integrator 12 and also to the non-inverting input of amplifier 14. Assume initially that the reference signal switch 20 has connected the negative reference signal −RS to the inverting input of the integrator 12 and that the input signal voltage is such that the non-inverting input to the integrator 12 is more positive than the inverting input. This condition causes the output of the integrator 12 to ramp in a positive direction. The rate of this positive excursion is determined by the voltage of the input signal and by the product of the capacitance of the capacitor C and resistance of a resistor R connected between the inverting input of integrator 12 and switch 20.

The inverting input to the level detecting amplifier 14 is illustratively maintained at a ground potential e.g., zero volts. As the output of integrator 12 continues to move in a positive direction, the non-inverting input to the level detecting amplifier 14 eventually becomes more positive than the inverting input thereto. When this condition is reached, the output of the amplifier 14 immediately goes positive, or to a high logic level. The output of the amplifier 14 connects to the D-input of the logic means 16. Thus, the D-input to the logic means 16 also shifts to a high level.

As noted, logic means 16 is a D-type flip-flop circuit which receives a clock signal at a CLK input from the clock signal generator 18. Although the D-input to the logic means 16 is at a high level, the Q-output thereof remains at a low logic level until the next clock pulse is received. The leading, or positive going, edge of the next clock pulse causes the Q-output of the logic means 16 to shift to a high level. The Q-output of logic means 16 remains at a high level until both the D-input shifts back to a low level and another clock pulse is received from generator 18.

The Q-output of the logic means 16 which is also the output 24 of the converter as a whole connects to the input of the reference signal switch 20. When the input to the switch 20 is at a low level, the switch connects the negative reference voltage,−RS, to its output. Conversely, when the input to the switch 20 is at a high level, the switch 20 connects the positive reference voltage, +RS, to its output. Thus, when the Q-output of the logic means 16 shifts to a high level, the switch 20 connects +RS via resistor R to the inverting input of the integrator 12, to which is also connected the feedback capacitor C. Charging current thus flows through the resistor R into the capacitor C.

Eventually, the charge into the capacitor C becomes such that the inverting input to the integrator 12 is mnore positive than the non-inverting input thereto, whereupon, the output of the integrator 12 starts to ramp in a negative direction. When the output of the integrator 12 becomes more negative than the inverting input to the amplifier 14, the output of the amplifier 14 immediately shifts back to a low level. The D-input to the logic means 16 is thus again low. The next clock pulse received at the CLK input to logic means 16 causes the Q-output thereof to shift back to a low level. The switch 20, in turn, connects −RS to the resistor R. The converter 10 is thus returned to its initial condition, and the cycle is thereafter repeated.

Thus it can be seen that the converter 10 is an oscillating circuit. The output 24 of the converter, taken from the Q-output of logic means 16 is pulsed between high and low logic levels at a rate dependent upon the voltage of the input signal at 22. Specifically, as the voltage of the input signal approaches +RS, the frequency of the output 24 approaches zero. Similarly, as the voltage of the input signal approaches −RS, the frequency of the output 24 also approaches zero. When the input signal is exactly halfway between +RS and −RS, i.e., at zero volts, the frequency of the output 24 is exactly equal to one-half the frequency of the clock signal supplied by the generator 18.

Additionally, as the input signal approaches +RS, the time period during which the pulsed output 24 is at a high logic level increases, while the time period during which the output 24 is at a low level decreases. That is, the duty cycle of the output 24 approaches 100 percent as the input signal approaches +RS and as the input signal approaches −RS, the duty cycle of the output 24 approaches 0 percent. When the input signal is at zero volts, the duty cycle of the output 24 is exactly 50 percent. Thus, the polarity of the input signal is indicated by whether the output 24 has a duty cycle greater or less than 50 percent.

Figure 2:
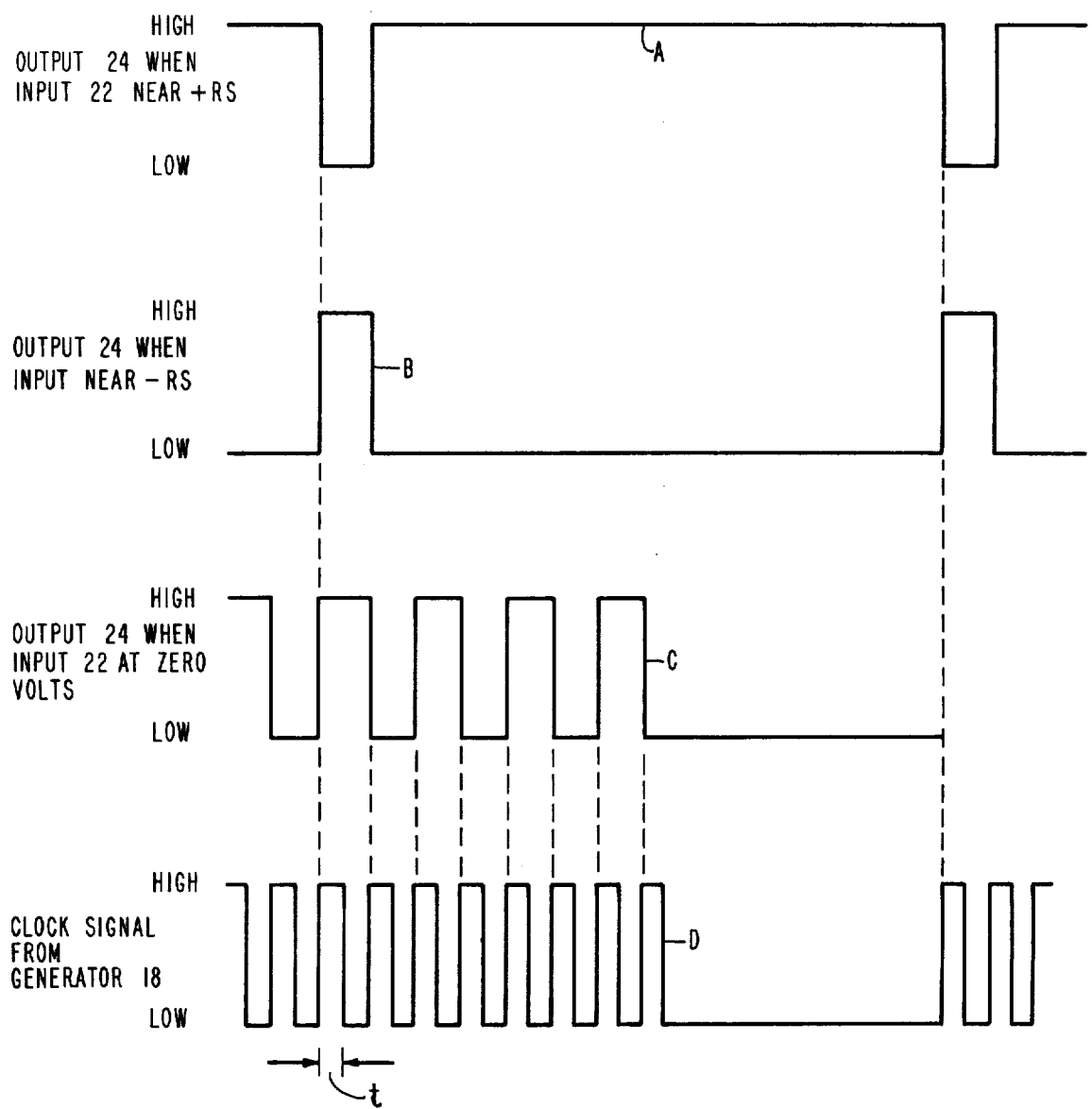

Typical waveshapes of the output 24 of the converter 10 are illustrated in FIG. 2 for different input signal voltages and polarities. Curve A in FIG. 2 represents the output 24 when the input signal is near +RS, while curve B represents the output 24 when the input signal is near −RS. Curve C represents the output 24 when the input signal is equal to the zero volts. The clock signal from generator 18 is illustrated by curve D.

As seen from FIG. 2, oscillations of the converter 10 are synchronized to the frequency of the clock signal supplied by the generator 18. Because of the action of the logic means 16, the time period during which the output 24 is in either a high or low state is always an integer, n, times the clock pulse length, $t$, (curve D in FIG. 2), where $n$ is equal to 1,2,3, . . . . Thus, the charging cycles, whether they be positive or negative, will always be an integral multiple of a clock pulse length in duration. This is a desirable feature of the converter 10, particularly where the pulsed output 24 is accumulated in a counter for a fixed period of time to display a digital number indicative of the voltage of the input signal. The digital number stored in such a case represents the net number of complete clock pulses during which the output 24 is high in the case of a net positive input signal, or low in the case of a net negative input signal.

Since only the leading, or positive-going edges of the clock pulses from the generator 18 are used to establish the duration of the positive and negative charging cycles of the capacitor C, the symmetry of the clock pulses is not critical. Also, because the switch 20 continuously alternates between +RS and −RS and positive charging cycles are continuously opposed by negative charging cycles, the exact frequency of the clock signal from the generator 18 is not critical. Thus, the converter 10 does not require an accurate clock signal generator 18. In fact, the frequency of the clock signal from the generator 18 can change over a significant range i.e., 5 to 1, without affecting the calibration accuracy of the converter 10.

The fact that the converter 10 continuously alternates positive and negative charging cycles gives rise to still other advantages. Specifically, the effect that the resistance of switch 20 has on the accuracy of the converter 10 largely cancels out. Also, the average current through the resistor R is zero. Thus, changes in the resistance of the resistor R tend to cancel with time and do not critically effect the accuracy of the converter 10. The resistor R thus need not be a precision, stable component. Similarly, the effects of the capacitor C tend to cancel with time, so that it also need not be a precision, stable component.

Figure 3:
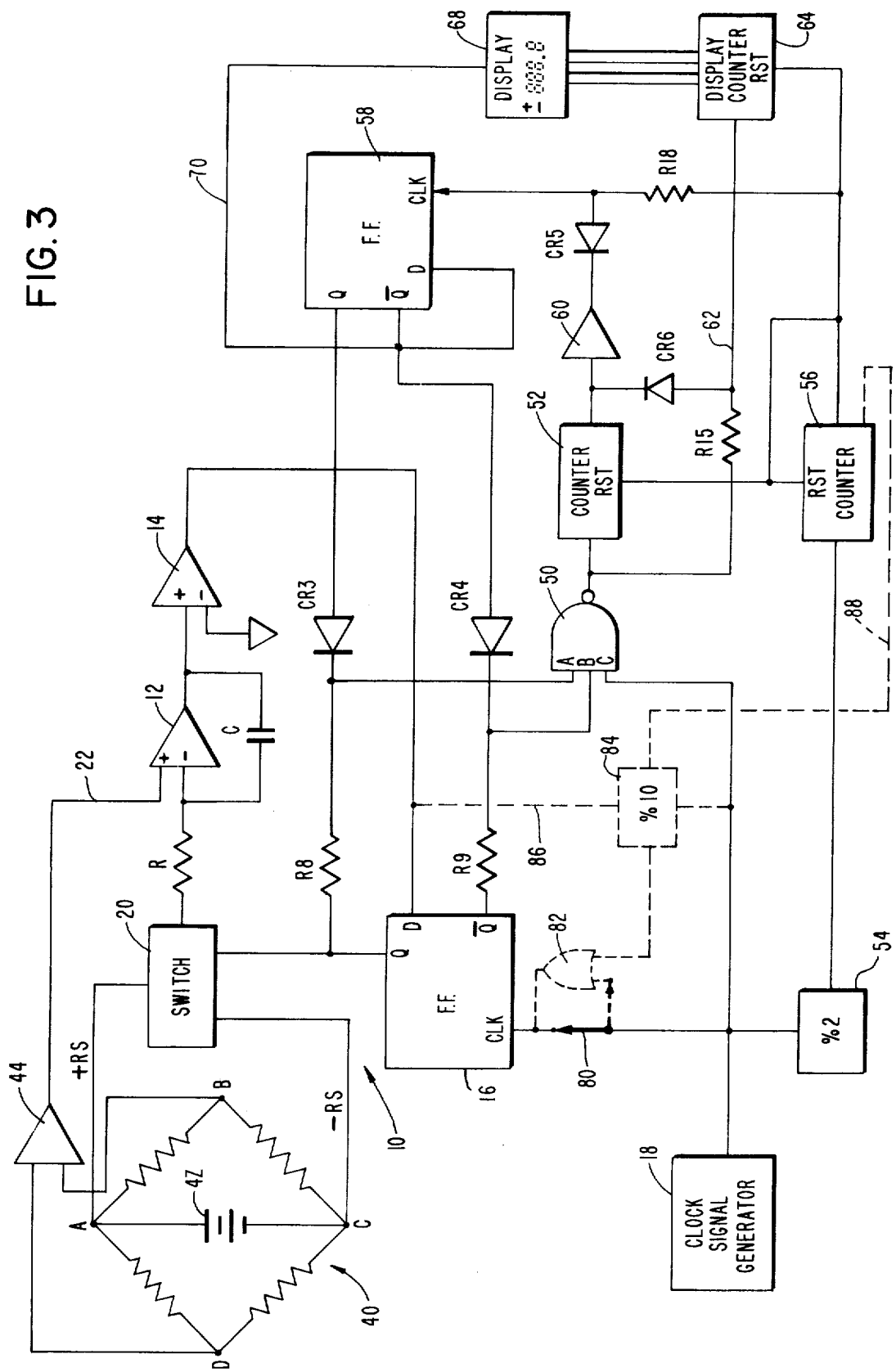
FIG. 3 illustrates typical waveshapes developed by the converter of FIG. 1.

FIG. 3 shows a circuit utilizing the converter 10 of FIG. 1 to convert an output signal from a transducer bridge 40 to a form suitable for digital display. The transducer bridge 40 may, for example, be a strain-gauge resistance bridge or any other type of bridge.

The elements of the converter 10 shown in FIG. 3 labeled with the same reference characters as in FIG. 1 are illustratively identical to those shown in FIG. 1. A power supply 42 maintains points A and C of the bridge 40 at +RS and −RS, respectively. These reference voltages are applied to the reference signal switch 20 of the converter 10. The converter 10 operates as described above to produce an output signal at the Q output of the logic means 16 having a frequency and duty cycle corresponding to the voltage and polarity, respectively, of the output signal from the bridge 40. That output is taken from points B and D of the bridge and applied to the comparator input 22 by way of an amplifier 44.

As is known, the $\overline{Q}$ output of the logic means 16 is the complement of the Q output thereof. Thus, when the Q output is at a high level, the $\overline{Q}$ output is at a low level, and vice versa. The Q output of the logic means 16 is coupled through a resistor R8 to input A of a NAND gate 50. The $\overline{Q}$ output of the logic means 16 is coupled through a resistor R9 to input B of the NAND gate 50. Clock pulses from the generator 18 are applied to input C of the NAND gate 50 as well as to CLK input of logic means 16. The clock pulses are gated through the gate 50 under the control of the inputs A and B thereto.

The output of gate 50 connects to a counter 52. The clock pulses from the generator 18 are also fed through a "divide by 2" circuit 54 to another counter 56. The pulses are thus supplied to the counter 56 at a rate equal to one half the frequency of the clock signal. Counters 52 and 56 have the same count capacity. The output of each counter is normally at a low level shifts to a high level when the number of pulses received thereby equals its count capacity.

As seen in FIG. 3, the Q output of a flip-flop 58 connects through a diode CR3 and the resistor R8 to the Q output of the logic means 16. The $\overline{Q}$ output of the flip-flop 58 connects through another diode CR4 and the resistor R9 to the $\overline{Q}$ output of the logic means 16. Also, the D-input to the flip-flop 58 and the $\overline{Q}$ output thereof are interconnected. As a result, every time a positive-going transition is received at the CLK input of the flip-flop 58, the Q and $\overline{Q}$ outputs thereof shift in level. Flip-flop 58 receives its clocking pulses from counter 56 via a resistor R18.

Because of the action of diodes CR3 and CR4 and resistors R8 and R9, inputs A and B to the NAND gates 50 will both be enabled (i.e., both at a high level) only when the Q outputs of logic means 16 and flip-flop 58 are at opposite logic levels. Only under these conditions is the gate 50 enabled to pass clock pulses to the counter 52. The counter 56, on the other hand, continuously receives clock pulses at a rate equal to one half the frequency of the clock signal.

Assume initially that the Q output of the flip-flop 58 is at a low level and its $\overline{Q}$ output is at a high level. Assume further that the signal from the bridge 40 and applied to the input 22 of the converter 10 is equal to +RS. As noted earlier, the Q output of the logic means 16 is a constantly high level signal when the input signal to the converter 10 is equal to +RS. Inputs A and B to the gate 50 are thus both at a high level and the gate 50 passes clock pulses to the counter 52 at a rate equal to the frequency of the clock signal. A diode CR6 prevents the clock pulses from passing along a line 62 while the counter 52 is being filled, since during this time, the cathode of the diode CR6 is maintained at a low level. Because the counter 52 is receiving pulses at twice the rate at which the counter 56 is receiving pulses, the counter 52 reaches its count capacity when the counter 56 is only half full.

When the counter 52 is full, its output shifts to a high level. The diode CR6 now allows the clock pulses to pass along the line 62 through a resistor R15 to a display counter 64. The clock pulses are accumulated in the display counter 64 until the counter 56 reaches its count capacity.

When the counter 56 reaches its count capacity, its output shifts to a high level. The positive-going transition of the output of the counter 56 resets the counters 52 and 56 and also resets the display counter 64 causing the number therein to be transferred to and displayed by a digital display device 68. The digital number displayed in this case is equal to one half the count capacity of the counters 52 and 56 and corresponds to an input signal magnitude of RS.

As the counter 56 reaches its count capacity, the positive-going transition of its output is also coupled through a resistor R18 toward the CLK input of the flip-flop 58. However, an inverter 60 is at this time holding the cathode of a diode CR5 at a low level, preventing the positive going transition from reaching the CLK input of the flip-flop 58. The levels of the Q and Q outputs of the flip-flop 58 thus do not change. A line 70 couples the $\overline{Q}$ output of the flip-flop 58 to the display device 68. The line 70 is at a high level causing the display device 68 to display a positive polarity for the input signal.

Assume now that the signal applied to the input 22 of the converter 10 shifts rapidly to −RS. As noted, the Q output of the logic means 16 in the converter 10 remains constantly low when the input signal thereto is equal to −RS. Input A to the gate 50 of FIG. 3 is thus now disabled since both the Q outputs of logic means 16 and flip-flop 58 are at a low level. No clock pulses are thus passed by the gate 50 to the counter 52. The counter 56, however, continues to fill at a rate equal to one half frequency of the clock signal.

Since the counter 52 never fills in this case, its output remains at a low level. The inverter 60 thus maintains the cathode of the diode CR5 at a high level. When the counter 56 eventually reaches its count capacity, the positive-going transition of its output is passed to the CLK input of the flip-flop 58. The respective levels of the Q and $\overline{Q}$ outputs of the flip-flop 58 thus reverse. The $\overline{Q}$ output of the flip-flop 58 shifts to a low level and the line 70 couples this low level to the display device 68.

Since no clock pulses are passed by the gate 50, no pulses reach the display counter 64 and the display device 68 displays a zero digital number. It, however, indicates a change in the polarity of the input signal. After the counters 52 and 56 are reset and the counting process is repeated, a digital number corresponding to an input signal magnitude of RS will be displayed, along with a negative polarity indication.

If the signal applied to the input 22 of the converter 10 in FIG. 3 is somewhere between +RS, the digital number displayed by the display device 68 will be proportionally less than that corresponding to a full scale signal magnitude equal to RS. For example, if the input signal is at zero volts, a zero digital number will be displayed. Provided the polarity indicated by the flip-flop 58 corresponds to that of the input signal, the count frequency into the counter 52 will always be greater than the count frequency into the counter 56, causing the counter 52 to fill first. The counter 56 fills first only when the polarity indicated by the flip-flop 58 is incorrect.

It will also be noted that if the input signal varies rapidly between a positive and negative polarity during a counting cycle, the digital number and polarity displayed corresponds to the net number of complete clock periods during which the input signal is positive in the case of a net positive signal or negative in the case of a net negative signal. The digital number displayed thus represents a true integral of the input signal over the counting time period.

The resolution (and accuracy) of the circuit illustrated in FIG. 3 depends, among other factors, upon the count capacities of the counters 52 and 56. For example, with a clock signal frequency of 100,00 pulses per second and count capacities of 20,000 counts for the counters 52 and 56 (corresponding to digital displays of ±10,000 counts for input signals equal to ±RS), I have achieved accuracies of about 0.01 percent using an ordinary ±10 percent carbon resistor for the resistor R and an ordinary Mylar capacitor for the capacitor C.

Ideally, an improved resolution should be obtainable by increasing the count capacity of the counters 52 and 56. However, because the switching characteristics of the reference signal switch 20 are, in practice, less than ideal, errors resulting therefrom increase as the clock frequency increases. This can cause the overall accuracy of the circuit to remain essentially the same regardless of any increase in clock signal frequency.

The elements shown in dotted outline in FIG. 3 illustrate one possible embodiment for taking advantage of an increased clock frequency and count capacity by minimizing the effect of the non-ideal switching characteristics of the switch 20 on the overall accuracy of the circuit.

Assume, for example, that the frequency of the clock signal from the generator 18 in FIG. 3 and the count capacity of the counters 52 and 56 are each increased by a factor of ten to, say, 1,000,000 pulses per second and 200,000 counts, respectively. This corresponds to digital displays of ±100,000 counts for input signals equal to ±RS. Assume further that switch 80 in FIG. 3 is moved as indicated in the dotted outline to contact one input of an OR gate 82. The other input to the OR gate 82 is the output from a "divide by 10" circuit 84. The circuit 84 receives the clock signals from the generator 18 and also receives control signals from the output of the level detecting amplifier 14 and the counter 56 along lines 86 and 88, respectively.

Prior to the start of an integration cycle, the output of the circuit 84 is at a low level. The OR gate 82 thus passes the clock signal at full frequency (e.g. 1,000,000 pulses per second) to the CLK input of the logic means 16. The circuit in this case operates exactly as described above, however, with the circuit oscillating at 10 times the rate of the circuit previously described because of the increased clock frequency.

The start of an integration cycle is synchronized to the positive transition of the output of the level detecting amplifier 14. This positive transition is coupled by the line 86 to activate the "divide by 10" circuit 84. When the circuit 84 is activated, the logic means 16 receives 1/10th of the clock frequency (i.e., 100,000 pulses per second) at its CLK input. Thus, once an integration cycle is commenced, the circuit is forced to oscillate again at the lower frequency.

The output 88 of the counter 56 is arranged to shift to a high level at some point just prior to the time that the counter 56 reaches its full count capacity; that is, at a point in time just prior to the completion of the integration cycle. Illustratively, the output 88 of counter 56 goes to a high level when the count into the counter 56 is about 95 percent of its capacity (i.e., 190,000 counts). When the line 88 shifts to a high level, the "divide by 10" circuit 84 is deactivated. The logic means 16 thus again receives the full clock frequency (i.e. 1,000,000 pulses per second).

Thus, it can be seen that during the majority of each integration cycle, the switching characteristics of the reference signal switch 20 have 1/10 of the effect they would have had the circuit continuously oscillated at the increased frequency. The number of cycles during which the switching errors reduce accuracy (that is, during which the increased clock frequency is in effect) represent a small proportion of the total number of cycles during a counting period, so that the effect of the switch characteristics on the overall accuracy of the circuit is negligibly small.

Figure 4:
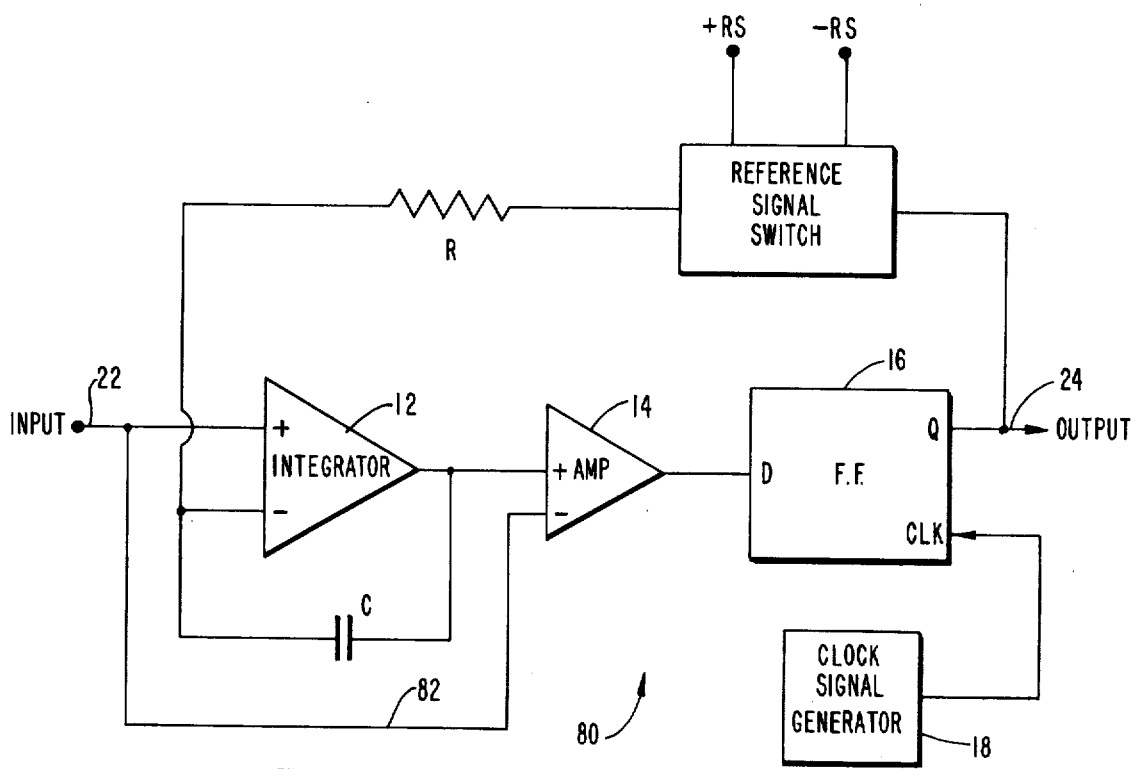
FIG. 4 shows a modified embodiment of the voltage to frequency converter of FIG. 1.

FIG. 4 of the drawing illustrates another converter 80 embodied in accordance with my invention.

The converter 80 of FIG. 4 includes the same elements as the converter 10 of the FIG. 1 which are labeled by the same reference characters as in FIG. 1. In the converter 80, however, the input signal is applied not only to the non-inverting input of the integrator 12 but is also fed by a line 82 to the inverting input of the level detecting amplifier 14.

The converter 80 operates in the same manner as the converter 10 of FIG. 1 to produce a pulsed output 24 of the type illustrated in FIG. 2. However, in the converter 80, the average voltage across the capacitor C remains zero. the net leakage currents in the capacitor C are thus zero. Any errors due to these leakage currents or to changes in the characteristics of the capacitor C thus tend to cancel with time. The capacitor C thus need not be a precision, stable component.

In summary, therefore, I have described a voltage to frequency converter of high accuracy, but of economical construction. Because positive integration cycles are continuously opposed by negative integration cycles and because each integration cycle is an integral multiple of a clock pulse length, errors caused by changes in the characteristics of the various components of the converter tend to cancel with time. Inexpensive, non-precision components can thus be used without sacrificing converter accuracy.

Since various changes may be made in the above description without departing from the scope of the invention, it is intended that all matter contained in the above description and shown in the accompanying drawings be interpreted as illustrative and not in a limiting sense. It is also to be understood that the following claims are intended to cover all of the generic and specific features of the invention herein described.

What I claim as new and seek to secure by Letters Patent of the United States is:

1. A voltage to frequency converter comprising:
    A. integrating means having an input connected to receive an input signal and an output;
    B. level detecting means responsive to the output of said integrating means for producing an output at a first level responsive to the integrating means output being greater than a predetermined level and an output at a second level responsive to the integrating means output being less than said predetermined level;
    C. clock means for generating a clock signal including periodic clock pulses;
    D. logic means having an input connected to receive the output of said level detecting means, an input connected to receive the clock pulses from said clock means and an output for producing an output at a first level responsive to the receipt of a clock pulse and the output of said level detecting means being at the first level and for producing an output at a second level responsive to the receipt of a clock pulse and the output of said level detecting means being at the second level;
    E. reference signal source means for producing first and second reference signals of equal magnitude but opposite polarity;
    F. switch means having an input connected to receive the output of said logic means, an input connected to receive the first and second reference signals from said reference signal source means, and an output connected to the input of said integrating means for applying the first reference signal to said integrating means when
    G. output means for coupling the output of said logic means as a pulsed output signal of said converter, said output signal having a pulse frequency corresponding to the voltage of the input signal and a pulse duty cycle corresponding to the polarity of the input signal;
    H. gating means selectively passing the clock pulses from said clock means to its output during the time period in which the output of said logic means is at one of the first or second levels; and
    I. counting means connected to the output of said gating means for establishing a digital count corresponding to the voltage of the input signal,
    said counting means comprising
        1. a first counter connected to receive the output of said gating means:
        2. dividing means having an input for receiving clock pulses from said clock means for producing an output having a frequency equal to one half the frequency of the clock pulses from said clock means;
        3. a second counter connected to receive the output of said dividing means;
        4. a third counter coupled to the output of said gating means;
        5. means responsive to said first counter attaining a selected count for passing the clock pulses passed by said gating means to said third counter; and
        6. means responsive to said second counter attaining said selected count for resetting said first and second counters, the count into said third counter corresponding to the net voltage of the input signal over the time period required for said second counter to attain said selected count.

2. A converter as recited in claim 1 further including polarity detecting means coupled to the output of said logic means for producing an output at a first and second level responsive to the output of said logic means having a net duty cycle greater than and less than 50 percent, respectively, over the time period required for said second counter to attain said selected count, said polarity detecting means output at the first level corresponding to a net positive polarity for the input signal and said polarity means at the second level corresponding to a net negative polarity for the input signal.

3. A converter as recited in claim 1 in which said counting means further includes a second dividing means coupled between said clock means and the clock pulse input to said logic means for producing an output having a frequency equal to a fraction of the frequency of the clock pulses from said clock means, means responsive to the output of said level detecting means shifting between its first and second levels for activating said second dividing means and means responsive to said second counter attaining a count slightly less than said selected count for deactivating said dividing means, whereby said logic means receives the full clock pulse frequency only for a limited portion of the time period required for said second counter to attain said selected count and errors arising from the switching of said switch means are minimized.

4. A converter as recited in claim 3 in which said second dividing means produces an output having a frequency equal to about one-tent of the frequency of the clock pulses from said clock means and in which said deactivating means is responsive to said second counter attaining a count equal to about 95 percent of said selected count.

5. In combination with a voltage to frequency converter of the type including an input for receiving an unknown input signal, an output and clock means for generating a clock signal including periodic clock pulses, said converter being adapted for producing an output signal pulsed between first and second signal levels with a pulse frequency corresponding to the magnitude of the input signal and a pulse duty cycle corresponding to the polarity of the input signal, counting means connecting to the output of said converter, said counting means including 1. gating means for selectively passing clock pulses from the clock means during the time period in which the converter output signal is in one of its first or second signal levels,
2. first counting means connected to receive the output of said gating means,
3. means for producing an output having a frequency equal to one half the frequency of the clock pulses from the clock means,
4. second counting means connected to receive the output of said producing means, and
5. third counting means coupled to the output of said gating means and responsive to said first counting means attaining a selected count for receiving the clock pulses passed by said gating means, the count accumulated in said third counting means over the time period required for said second counting means to attain said selected count corresponding to the net magnitude of the unknown input signal.

6. Apparatus as recited in claim 5 in which said counting means further includes polarity detecting means coupled to receive the converter output signal for producing an output at a first and second level responsive to the converter output signal having a net duty cycle greater than and less than 50 percent, respectively, over the time period required for said second counting means to attain said selected count, said polarity detecting means output at the first level corresponding to a net positive polarity for the unknown input signal and said polarity detecting means output at the second level corresponding to a net negative polarity for the unknown input signal.

* * * * *